United States Patent
King

(10) Patent No.: US 7,365,570 B2
(45) Date of Patent: Apr. 29, 2008

(54) PSEUDO-DIFFERENTIAL OUTPUT DRIVER WITH HIGH IMMUNITY TO NOISE AND JITTER

(75) Inventor: Greg King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 11/137,978

(22) Filed: May 25, 2005

(65) Prior Publication Data
US 2006/0267633 A1    Nov. 30, 2006

(51) Int. Cl.
*H03K 19/0175* (2006.01)
(52) U.S. Cl. .............................. 326/82; 326/30; 326/83
(58) Field of Classification Search .................. 326/26, 326/27, 30, 82–87
See application file for complete search history.

(56) References Cited

U.S. PATENT DOCUMENTS

| | | | |
|---|---|---|---|
| 3,473,160 A | 10/1969 | Wahlstrom | |
| 3,633,120 A | 1/1972 | Battjes | |
| 4,333,058 A | 6/1982 | Hoover | |
| 4,527,079 A | 7/1985 | Thompson | |
| 4,658,156 A | 4/1987 | Hashimoto | |
| 4,723,110 A | 2/1988 | Voorman | |
| 4,797,631 A | 1/1989 | Hsu et al. | |
| 4,853,560 A | 8/1989 | Iwamura et al. | |
| 5,059,835 A | 10/1991 | Lauffer et al. | |
| 5,067,007 A | 11/1991 | Otsuka et al. | |
| 5,144,167 A | 9/1992 | McClintock | |
| RE34,808 E | 12/1994 | Hsieh | |
| 5,420,538 A | 5/1995 | Brown | |
| 5,491,455 A | 2/1996 | Kuo | |
| 5,521,530 A | 5/1996 | Yao et al. | |
| 5,557,219 A | 9/1996 | Norwood et al. | |
| 5,589,783 A | 12/1996 | McClure | |
| 5,689,195 A | 11/1997 | Cliff et al. | |
| 5,742,178 A | 4/1998 | Jenkins, IV et al. | |
| 5,764,086 A | 6/1998 | Nagamatsu et al. | |
| 5,801,548 A | 9/1998 | Lee et al. | |
| 5,936,423 A | 8/1999 | Sakuma et al. | |
| 5,939,904 A | 8/1999 | Fetterman et al. | |
| 5,942,940 A * | 8/1999 | Dreps et al. ................ | 330/253 |
| 5,958,026 A | 9/1999 | Goetting et al. | |

(Continued)

FOREIGN PATENT DOCUMENTS

EP    0 575 124    5/2001

OTHER PUBLICATIONS

B. Gilbert, "The Multi-Tahn Priniciple: A Tutorial Overview," IEEE Journal of Solid-State Circuits, vol. 33, No. 1, Jan. 1996.

(Continued)

*Primary Examiner*—Don Le
(74) *Attorney, Agent, or Firm*—Ropes & Gray LLP; Jeffrey H. Ingerman; Chia-Hao La

(57) ABSTRACT

Circuits and methods are provided for transmitting a pseudo-differential output signal with relatively high immunity to noise and jitter. The output driver of the invention receives two differential input signals and outputs a single output signal with low voltage transistors and programmable impedance and on-die termination circuits. The pseudo-differential output driver consumes little circuit area and has low output capacitance.

21 Claims, 4 Drawing Sheets

U.S. PATENT DOCUMENTS

| | | | |
|---|---|---|---|
| 5,970,255 A | 10/1999 | Tran et al. | |
| 5,977,796 A * | 11/1999 | Gabara | 326/86 |
| 6,040,712 A | 3/2000 | Mejia | |
| 6,154,047 A * | 11/2000 | Taguchi | 326/30 |
| 6,175,952 B1 | 1/2001 | Patel et al. | |
| 6,201,405 B1 * | 3/2001 | Hedberg | 326/30 |
| 6,215,326 B1 | 4/2001 | Jefferson et al. | |
| 6,222,388 B1 * | 4/2001 | Bridgewater, Jr. | 326/86 |
| 6,236,231 B1 | 5/2001 | Nguyen et al. | |
| 6,252,419 B1 | 6/2001 | Sung et al. | |
| 6,281,715 B1 | 8/2001 | DeClue et al. | |
| 6,288,581 B1 | 9/2001 | Wong | |
| 6,373,278 B1 | 4/2002 | Sung et al. | |
| 6,377,076 B1 | 4/2002 | Gauthier | |
| 6,433,579 B1 | 8/2002 | Wang et al. | |
| 6,650,140 B2 | 11/2003 | Lee et al. | |
| 6,724,328 B1 | 4/2004 | Lui et al. | |
| 6,836,149 B2 * | 12/2004 | Chow | 326/83 |
| 6,854,044 B1 | 2/2005 | Venkata et al. | |
| 6,940,302 B1 | 9/2005 | Shumarayev et al. | |
| 6,956,407 B2 | 10/2005 | Baig et al. | |
| 6,977,534 B2 * | 12/2005 | Radelinow | 327/112 |
| 2003/0052709 A1 | 3/2003 | Venkata et al. | |
| 2003/0141919 A1 | 7/2003 | Wang et al. | |
| 2004/0140837 A1 | 7/2004 | Venkata et al. | |
| 2005/0095988 A1 | 5/2005 | Bereza et al. | |
| 2005/0160327 A1 | 7/2005 | Baig et al. | |

OTHER PUBLICATIONS

K. Farzan, "A CMOS 10-Gb/s Power-Efficient 4-PAM Transmitter," IEEE Journal of Solid-State Circuits, vol. 39, No. 3, Mar. 2004, pp. 529-532.

"LVDS Owner's Manual; Design Guide," National Semiconductor Corporation, Spring 1997. Chapter 1, pp. 1-7, (no month).

"ORCA Series 3 Field-Programmable Gate Arrays, Preliminary Data Sheet, Rev. 01," Lucent Technologies Inc., Microelectronics Group, Allentown, PA, Aug. 1998, pp. 1-80.

"Optimized Reconfigurable Cell Array (ORCA), OR3Cxxx/OR3Txxx Series Field-Programmable Gate Arrays, Preliminary Product Brief," Lucent Technologies Inc., Microelectronics Group, Allentown, PA, Nov. 1997, pp. 1-7 and unnumbered back cover.

Patel, R. et al., "A 3.3-V Programmable Logic Device that Addresses Low Power Supply and Interface Trends," *IEEE 1997 Custom Integrated Circuits Conference*, May 1997, pp. 539-542.

"Using Phase Locked Loop (PPLs) in DL6035 Devices, Application Note," Dyna Chip Corporation, Sunnyvale, CA, 1998, pp. 1 and 1-6.

"Using the Virtex Delay-Locked Loop, Application Note, XAPP132, Oct. 21, 1998 (Version 1.31)," Xllinx Corporation, Oct. 21, 1998, pp. 1-14.

"Virtex 2.5V Field Programmable Gate Arrays, Advanced Product Specification, Oct. 20, 1998 (Version 1.0)," Xllinx Corporation, Oct. 20, 1998, pp. 1-24.

"DY6000 Family, FAST Field Programmable Gate Array, DY6000 Family Datasheet," Dyna Chip Corporation, Sunnyvale, CA, Dec. 1998, pp. 1-66.

* cited by examiner though single-ended output driver 100 is relatively simple, it suffers from many of the noise and jitter problems of traditional single-ended output drivers. Because only one

PSEUDO-DIFFERENTIAL OUTPUT DRIVER WITH HIGH IMMUNITY TO NOISE AND JITTER

BACKGROUND OF THE INVENTION

This invention relates to an integrated circuit driver. More particularly, this invention relates to a pseudo-differential output driver.

Drivers are common circuits used for transmission of signals, either between integrated circuits ("ICs") or within a single IC. For instance, driver circuitry can be used to transmit (1) data to and from a memory or (2) control signals to and from a memory controller. There are many types of drivers, each with their own advantages and disadvantages.

One type is a "single-ended" output driver, which receives an input signal and generates an output signal. Information is typically conveyed by the voltage of the output signal, which is substantially equal to either a relatively high voltage, such as that of a power supply ("VCC"), or a relatively low voltage, such as that of ground ("VSS"). Single-ended drivers are relatively simple, consume relatively little area, require a relatively low pin count, and have relatively low capacitance. However, they are quite susceptible to noise and jitter, such as that caused by unregulated power supply voltages.

In contrast, a "differential" output driver receives substantially concurrently two input signals and generates substantially concurrently two output signals. Information is typically conveyed by the voltage difference between the two output signals, with one voltage substantially equal to VCC and the other voltage substantially equal to VSS. Such pairs of input and output signals are known as differential signals. Differential output drivers are relatively immune to noise and jitter, because any noise or jitter that affects the voltage of one output signal will often affect in substantially the same way the voltage of the other output signal. However, differential drivers are often relatively complex, consume a relatively large amount of area, require a relatively high pin count, and have relatively high capacitance.

In view of the foregoing, it would be desirable to be able to provide a single-output driver with greater immunity to noise and jitter, while maintaining small size and low driver capacitance.

SUMMARY OF THE INVENTION

In accordance with this invention, a "pseudo-differential" output driver with relatively high immunity to noise and jitter is provided. The invention preferably includes two transistor chains coupled in parallel, each chain receiving a respective signal of a pair of differential signals. Each chain preferably includes two complementary transistors coupled in series. The pseudo-differential output is advantageously coupled to either one of the two chains, at a node that connects the two complementary transistors of that chain. An embodiment of the invention preferably includes programmable impedance circuitry coupled between VCC and the two transistor chains. In addition, programmable impedance and on-die termination ("ODT") circuitry is preferably coupled between the two transistor chains and VSS. These programmable circuitries can be used to program signaling voltage levels or to adjust for transistor and resistor process variations.

In another embodiment of the invention, the pseudo-differential output is preferably also coupled to VSS through the above programmable impedance and ODT circuitry. The output is also preferably coupled to VCC through another programmable impedance and ODT circuitry. These programmable circuitries can further adjust the voltage swing of the output signal and can be used to set the ODT values when the driver performs a read or termination transaction.

The invention advantageously generates a pseudo-differential output signal using two differential input signals. As a result, greater immunity to noise and jitter is achieved, as compared to a traditional single-ended driver.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
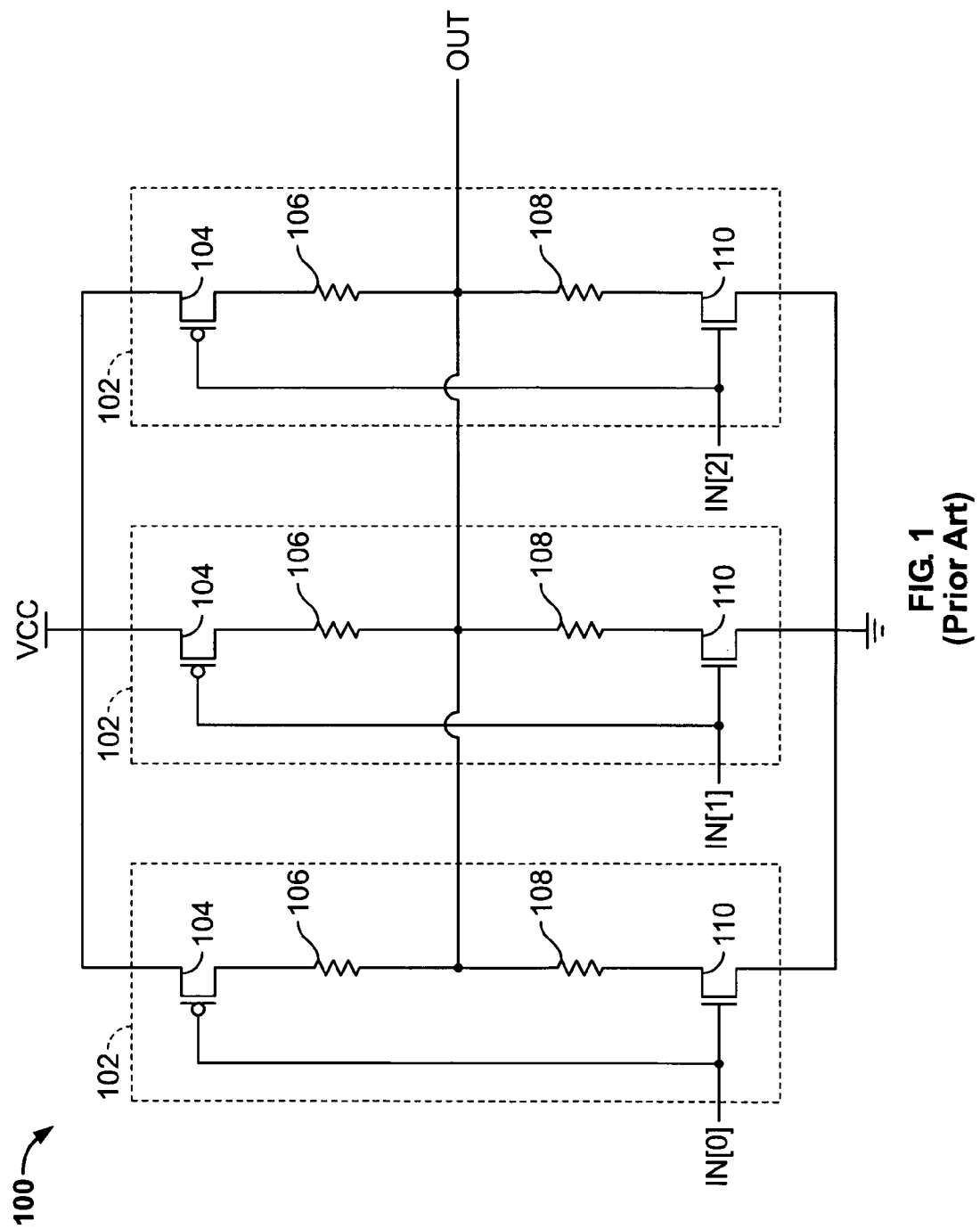
FIG. 1 is a circuit diagram of an illustrative single-ended output driver.

FIG. 1 illustrates a known single-ended output driver 100. Single-ended output driver 100 includes driver blocks 102 coupled in parallel between a source of relatively high voltage ("VCC") and a source of relatively low voltage ("VSS"). Each driver block 102 includes P-type metal-oxide semiconductor ("PMOS") transistor 104, resistors 106 and 108, and N-type metal-oxide semiconductor ("NMOS") transistor 110, all serially coupled between VCC and VSS. Although single-ended output driver 100 includes three driver blocks 102, any suitable number of driver blocks 102 can be used.

Each driver block 102 accepts a single bit IN[N] of input signal bus IN, which is coupled to the gates of PMOS transistor 104 and NMOS transistor 110, and drives output signal OUT, which is coupled between resistors 106 and 108. Each driver block 102 behaves substantially like an inverter without a full rail-to-rail voltage swing. That is, when its input signal IN[N] represents a logical 0, PMOS transistor 104 is activated and NMOS transistor 110 is deactivated, coupling output signal OUT to VCC through resistor 106 and driving output signal OUT to a voltage substantially equal to, but not necessarily exactly, a logical 1. On the other hand, when its input signal IN[N] represents a logical 1, NMOS transistor 110 is activated and PMOS transistor 106 is deactivated, coupling output signal OUT to VSS through resistor 108 and driving output signal OUT to a voltage substantially equal to, but not necessarily exactly, a logical 0. By coupling a plurality of driver blocks 102 in parallel between VCC and VSS, the overall resistance of single-ended output driver 100 can be varied by applying appropriate values to input signal bus IN.

Although single-ended output driver 100 is relatively simple, it suffers from many of the noise and jitter problems of traditional single-ended output drivers. Because only one input signal is used, the noise and jitter rejection of differential signals cannot be taken advantage of.

Figure 2:
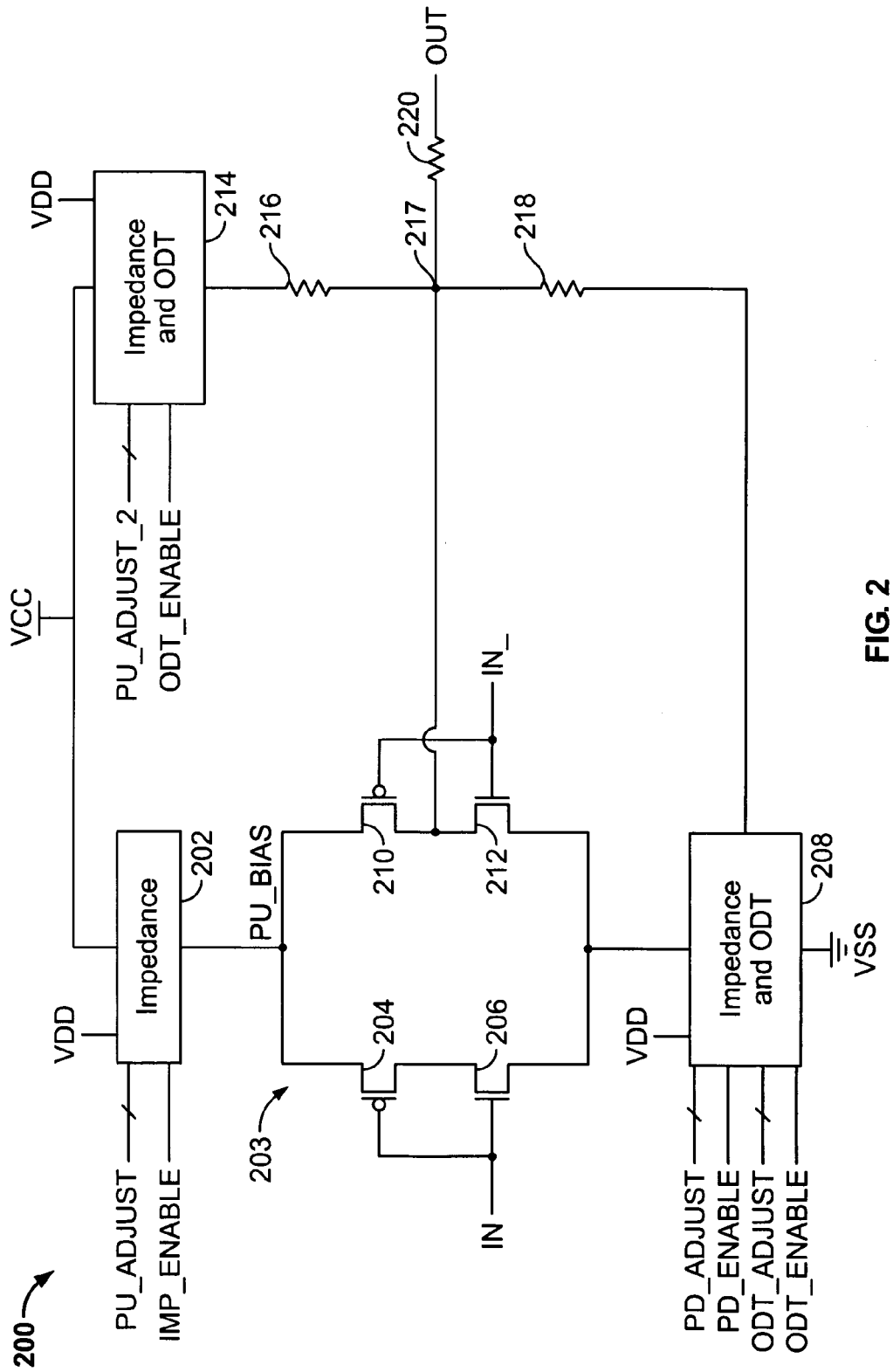
FIG. 2 is a circuit diagram of an embodiment of a pseudo-differential output driver in accordance with the invention.

FIG. 2 is a circuit diagram of an embodiment of a pseudo-differential output driver 200 in accordance with the invention. Pseudo-differential output driver 200 preferably includes impedance circuit 202, PMOS transistor 204, NMOS transistor 206, PMOS transistor 210, NMOS transistor 212, impedance and on-die termination ("ODT") circuit 208, impedance and ODT circuit 214, and resistors 216, 218, and 220.

Impedance circuit 202, switching circuitry 203 (which includes transistors 204, 206, 210, and 212), and impedance and ODT circuit 208 are coupled in series between a source of relatively high voltage (VCC) and a source of relatively low voltage (VSS). In addition, node 217 is preferably coupled to impedance and ODT circuit 214 through resistor 216, to impedance and ODT circuit 208 through resistor 218, and to pseudo-differential output node OUT through resistor 220.

Differential input signals IN and IN_ are received by switching circuit 203. In particular, input signal IN is applied to the gates of PMOS transistor 204 and NMOS transistor 206, while input signal IN_ is applied to the gates of PMOS transistor 210 and NMOS transistor 212. Pseudo-differential output node OUT is preferably coupled through resistor 220 to the drains of PMOS transistor 210 and NMOS transistor 212, which are coupled to each other.

Input signals IN and IN_ are complementary signals, i.e., one will be substantially equal to a logical 1 while the other will be substantially equal to a logical 0. Thus, at any given time during the operation of pseudo-differential output driver 200, only one PMOS transistor and one NMOS transistor in switching circuit 203 is activated. Output signal OUT is preferably pulled up or down, towards VCC or VSS, depending on whether IN represents a logical 1 and IN_ differential input signals IN and IN_ are used to drive output signal OUT, pseudo-differential output driver 200 is capable of greater immunity to noise and jitter than single-ended output driver 100.

Impedance circuit 202 affects the voltage swing of output signal OUT by providing programmable pull-up resistance. Impedance circuit 102 preferably uses independent power source VDD, whose voltage typically lies between VCC and VSS, as a reference. Relatively low voltage VDD is often used by the control logic of an IC, resulting in lower power consumption and small transistor sizes, while relatively high voltage VCC is reserved for more power-intensive circuits. Signal PU_ADJUST sets the resistance of impedance circuit 202, which can also be used to account for process variation in transistors and resistors of pseudo-differential output driver 200. Signal IMP_ENABLE enables or disables impedance circuit 202.

Impedance and ODT circuit 208 affects the voltage swing of output signal OUT by providing programmable pull-down resistance. Impedance and ODT circuit 208 preferably uses VDD as a reference. The resistance of impedance and ODT circuit 208 can be set by signal PD_ADJUST, which can also be used to adjust for process variation in transistors and resistors of pseudo-differential output driver 200. Circuit 208 can be enabled or disabled by signal IMP_ENABLE, which is also used by impedance circuit 202. On-die termination values of impedance and ODT circuit 208 can be adjusted by signal ODT_ADJUST, and the ODT of circuit 208 can be enabled or disabled by signal ODT_ENABLE. For instance, in the context of a memory interface, the ODT of impedance and ODT circuit 208 can be disabled during a write transaction and enabled during a read transaction.

Similarly, impedance and ODT circuit 214 affects the voltage swing of output signal OUT by providing programmable pull-up resistance. Impedance and ODT circuit 214 preferably uses VDD as a reference. The resistance of impedance and ODT circuit 214 can be set by signal PU_ADJUST_2, which can also be used to account for process variation in transistors and resistors of pseudo-differential output driver 200. The ODT of circuit 214 can be enabled or disabled by signal ODT_ENABLE, which is also used by impedance and ODT circuit 208. For instance, in the context of a memory interface, the ODT of impedance and ODT circuit 214 can be disabled during a write transaction and enabled during a read transaction.

Figure 3:
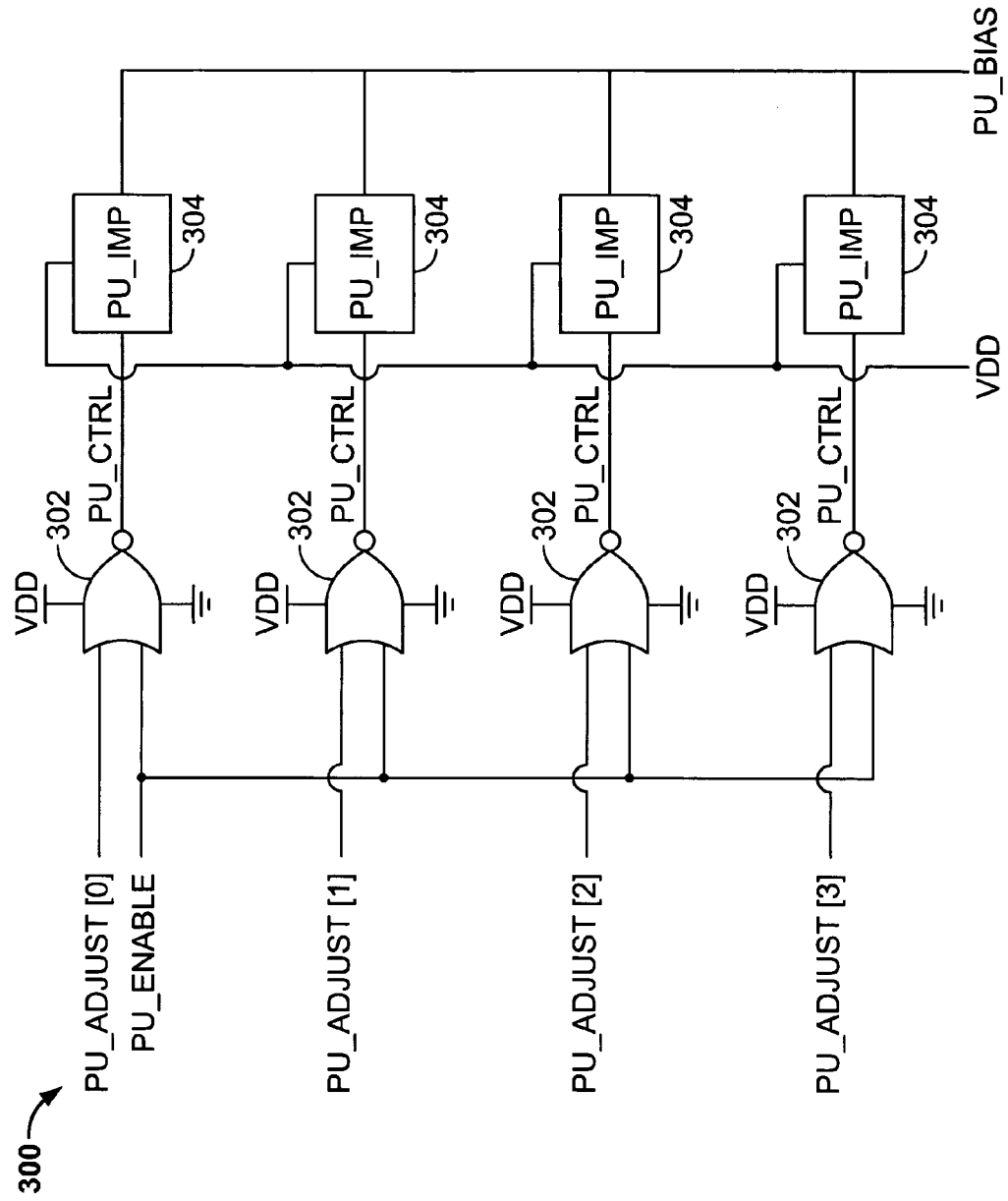
FIG. 3 is a circuit diagram of an embodiment of a pull-up impedance circuit in accordance with the invention.

FIG. 3 is a circuit diagram of an embodiment of a pull-up impedance circuit 300 in accordance with the invention. Pull-up impedance circuit 300 can be used as impedance circuit 202 of FIG. 2. Note that implementations of impedance circuit 202, impedance and ODT circuit 208, and impedance and ODT circuit 214 should be known to those of ordinary skill in the art. Thus, pull-up impedance circuit 300 is shown simply for illustrative purposes.

Pull-up impedance circuit 300 preferably includes a plurality of logical NOR gates 302 and a plurality of pull-up impedance sub-circuits 304. NOR gates 302 preferably use voltage VDD, which is preferably lower than power supply voltage VCC. Although four logical NOR gates 302 and four pull-up impedance sub-circuits 304 are shown, other numbers could be used. Each logical NOR gate 302 preferably receives signal PU_ENABLE and an input bit from control signal PU_ADJUST, and preferably generates an output signal PU_CTRL to a corresponding pull-up impedance sub-circuit 304. Each pull-up impedance sub-circuit 304 preferably outputs signal PU_BIAS, which preferably couples to switching circuitry 203 of FIG. 2.

Pull-up impedance circuit 300 can be disabled by applying a logical 1 to signal PU_ENABLE, which sets PU_CTRL to a logical 0 and deactivates pull-up impedance sub-circuits 304. The impedance of pull-up impedance circuit 300 can be adjusted by applying a logical 0 to signal PU_ENABLE and applying appropriate voltages to the bits of signal PU_ADJUST. In this way, a specified subset of pull-up impedance sub-circuits 304 can be activated, thereby setting the impedance of pull-up impedance circuit 300. In a preferred embodiment of pull-up impedance circuit 300, each pull-up impedance sub-circuit 304 carries a different amount of resistance.

Figure 4:
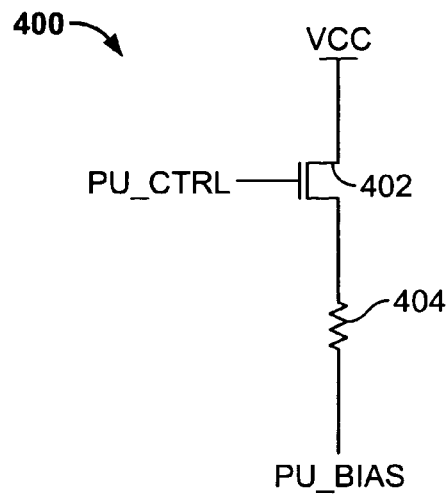
FIG. 4 is a circuit diagram of an embodiment of a pull-up impedance sub-circuit in accordance with the invention.

FIG. 4 is a circuit diagram of an embodiment of a pull-up impedance sub-circuit 400 in accordance with the invention. Pull-up impedance sub-circuit 400 can be used as pull-up impedance sub-circuit 304 of FIG. 3, and preferably includes NMOS transistor 402 and resistor 404. NMOS transistor 402 preferably serves as an enable device, responsive to signal PU_CTRL, which is applied to the gate of NMOS transistor 402.

The concepts and principles illustrated in FIGS. 3 and 4 can be extended to implementations of impedance and ODT circuits 208 and 214, with appropriate adjustments. For instance, a pull-down impedance sub-circuit in impedance and ODT circuit 208 preferably uses an NMOS transistor as an enable device, and couples this transistor between the corresponding variable resistor and voltage source VSS.

Because of the differential inputs, pseudo-differential output driver circuit 200 advantageously provides greater immunity to noise and jitter than traditional single-ended drivers. An embodiment of the invention preferably supports programmable resistance and on-die termination, to set parameters such as the voltage swing of the pseudo-differential output signal. In addition, the stacking of transistors in impedance circuit 202, switching circuitry 203, and impedance and ODT circuit 208 preferably allows lower-voltage transistors to be used, since the gate-to-source breakdown voltages of the transistors will typically not be exceeded. Lower-voltage transistors typically have significantly shorter gates, thereby resulting in less area consumption. Also, the use of smaller transistors can significantly reduce the capacitance seen by output signal OUT. For instance, transistor sizes can be reduced by approximately 30%, leading to a roughly 30% reduction in output capacitance.

Note that the embodiments of the invention described herein are for purposes of illustration only, and other embodiments that do not deviate from the spirit and scope of the invention are possible. For instance, as discussed above with respect to FIG. 3, other numbers of NOR gates 302 and pull-up impedance sub-circuits 304 can be used. In addition, NOR gates 302 can be replaced by any logic gate suitable to the application at hand. As another example, the choice of NMOS transistors and PMOS transistors could be reversed. As yet another example, the MOS transistors could be replaced with bipolar junction transistors without deviating from the spirit and scope of the present invention.

Figure 5:
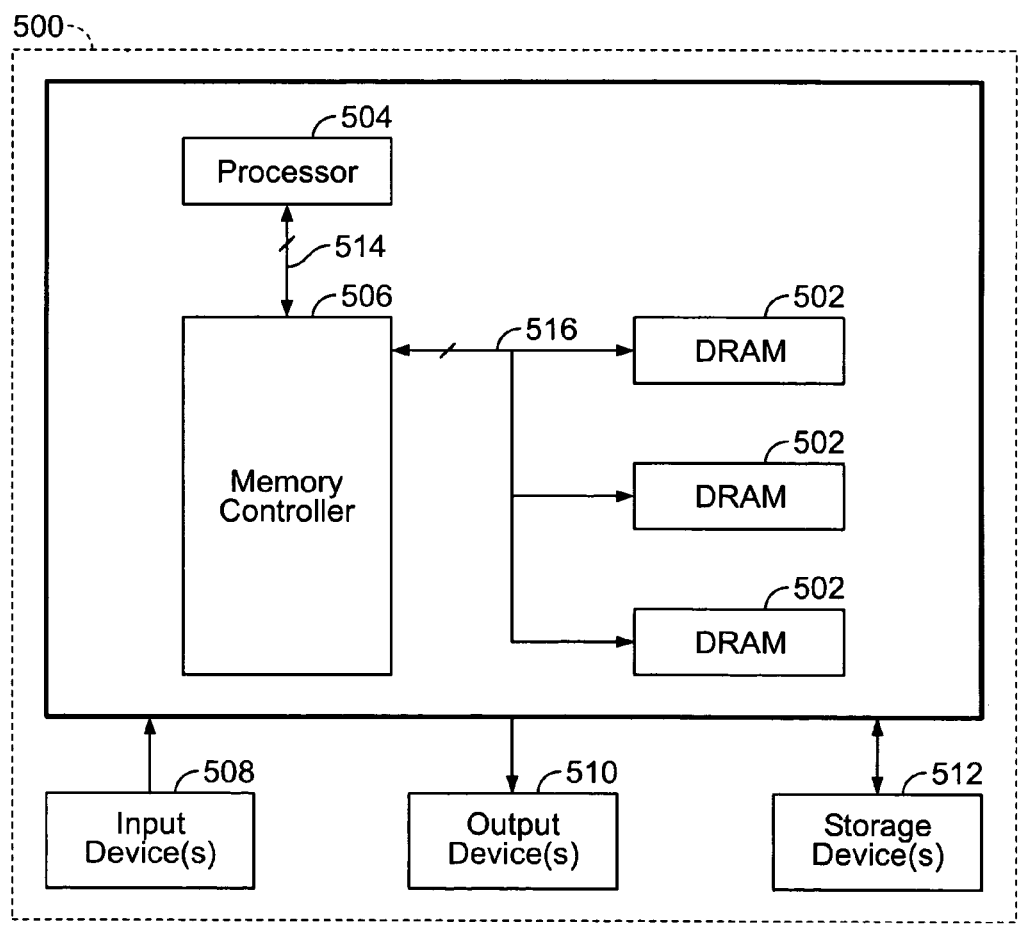
FIG. 5 is a block diagram of an illustrative system incorporating the invention.

FIG. 5 shows a system that incorporates the invention. System 500 includes a plurality of dynamic random access memory ("DRAM") devices 502, a processor 504, a memory controller 506, input devices 508, output devices 510, and optional storage devices 512. DRAM devices 502 include at least one pseudo-differential output driver (e.g., driver 200) in accordance with the invention. This driver transmits data or control signals with greater immunity to noise and jitter than traditional single-ended output drivers. Data and control signals are transferred between processor 504 and memory controller 506 via bus 514. Similarly, data and control signals are transferred between memory controller 506 and DRAM devices 502 via bus 516. Input devices 508 can include, for example, a keyboard, a mouse, a touch-pad display screen, or any other appropriate device that allows a user to enter information into system 500. Output devices 510 can include, for example, a video display unit, a printer, or any other appropriate device capable of providing output data to a user. Note that input devices 508 and output devices 510 can alternatively be a single input/output device. Storage devices 512 can include, for example, one or more disk or tape drives.

Thus it is seen that circuits and methods are provided for transmitting a pseudo-differential output signal with relatively high immunity to noise and jitter. One skilled in the art will appreciate that the invention can be practiced by other than the described embodiments, which are presented for purposes of illustration and not of limitation, and the present invention is limited only by the claims which follow.

I claim:

1. A circuit for transmitting an output signal, said circuit comprising:
   a first impedance operative to receive a first voltage;
   switching circuitry coupled to said first impedance, said switching circuitry comprising a first path and a second parallel path, said switching circuitry operative to receive first and second differential input signals at said first and second paths, respectively, and to generate said output signal at a node in only one of said paths, without generating another output signal in another of said paths, in response to receipt of said first and second differential input signals;
   a second impedance coupled to said switching circuitry and operative to receive a second voltage, wherein said output node is further coupled to said second impedance; and
   a third impedance coupled to said output node and operative to receive said first voltage.

2. The circuit of claim 1 wherein said third impedance comprises first resistor circuitry whose resistance is adjustable responsive to a voltage of a first resistance control signal.

3. The circuit of claim 1 wherein:
   said third impedance is coupled to said output signal through second resistor circuitry; and
   said output signal is coupled to said second impedance through third resistor circuitry.

4. The circuit of claim 1 wherein:
   said first path comprises first and second transistors coupled in series; and
   said second path comprises third and fourth transistors coupled in series.

5. The circuit of claim 4 wherein:
   gates of said first and second transistors are coupled to said first differential input signal; and
   gates of said third and fourth transistors are coupled to said second differential input signal.

6. The circuit of claim 5 wherein:
   said first and second transistors are complementary; and
   said third and fourth transistors are complementary.

7. The circuit of claim 5 wherein:
   said output signal is coupled to a connection between said third and fourth transistors.

8. The circuit of claim 1 wherein:
   said first impedance comprises first resistor circuitry whose resistance is adjustable responsive to a voltage of a first resistance control signal; and
   said second impedance comprises second resistor circuitry whose resistance is adjustable responsive to a voltage of a second resistance control signal.

9. The circuit of claim 8 wherein:
   said first impedance further comprises a first transistor coupled in series to said first resistor circuitry; and
   said second impedance further comprises a second transistor coupled in series to said second resistor circuitry.

10. A method f or transmitting an output signal from a driver circuit, said method comprising:
    receiving a first differential input signal at a first path;
    receiving a second differential input signal at a second parallel path, said second differential input signal complementary to said first differential input signal;
    driving said output signal at a node in only one of said paths, without driving another output signal in another of said paths, a voltage of said driven output signal being indicative of a difference in voltages of said first and second differential input signals;
    setting a resistance of first impedance circuitry, coupled in series to said paths, by applying a first control signal to said first impedance circuitry; and
    setting a resistance of second impedance circuitry, coupled in series to said paths, by applying a second control signal to said second impedance circuitry.

11. The method of claim 10 further comprising:
    activating a first transistor and deactivating a second transistor responsive to a voltage of said first differential input signal, wherein said first and second transistors are coupled in series; and
    activating a third transistor and deactivating a fourth transistor responsive to a voltage of said second differential input signal, wherein said third and fourth transistors are coupled in series.

12. The method of claim 11 wherein said activating said first transistor and said deactivating said second transistor couple said output signal to a source of substantially constant voltage through programmable impedance circuitry.

13. The method of claim 10 further comprising:
enabling said first impedance circuitry by applying a first enable/disable signal to a transistor of said first impedance circuitry; and
enabling said second impedance circuitry by applying a second enable/disable signal to a transistor of said second impedance circuitry.

14. The method of claim 11 further comprising disabling first on-die termination circuitry coupled in series to said paths by applying a first enable/disable signal to said first on-die termination impedance circuitry.

15. The method of claim 14 further comprising disabling second on-die termination circuitry coupled to said output signal by applying a second enable/disable signal to said second on-die termination impedance circuitry.

16. A system comprising:
a processor;
a memory controller;
a dynamic random access memory device comprising an array of memory cells and a circuit for transmitting an output signal, said circuit comprising:
a source of relatively low voltage;
a first impedance operative to receive a first voltage;
switching circuitry coupled to said first impedance, said switching circuitry comprising a first path and a second parallel path, said switching circuitry operative to receive first and second differential input signals at said first and second paths, respectively, and to generate said output signal at a node in only one of said paths, without generating another output signal in another of said paths, in response to receipt of said first and second differential input signals;
a second impedance coupled to said switching circuitry and operative to receive a second voltage, wherein said output node is further coupled to said second impedance; and
a third impedance coupled to said output node and operative to receive said first voltage.

17. The system of claim 16 wherein:
said first path comprises first and second transistors coupled in series; and
said second path comprises third and fourth transistors coupled in series.

18. The system of claim 17 wherein:
said first and second transistors are coupled to said first differential input signal; and
said third and fourth transistors are coupled to said second differential input signal.

19. The system of claim 18 wherein said output signal is coupled to a connection between said third and fourth transistors.

20. The system of claim 16 wherein:
said first impedance comprises first resistor circuitry whose resistance is adjustable responsive to a voltage of a first resistance control signal; and
said second impedance comprises second resistor circuitry whose resistance is adjustable responsive to a voltage of a second resistance control signal.

21. A circuit for transmitting an output signal from a driver circuit, said circuit comprising:
means for receiving a first differential input signal at a first path;
means for receiving a second differential input signal at a second parallel path, said second differential signal complementary to said first differential signal;
means for driving said output signal at a node in only one of said paths, without driving another output signal in another of said paths, a voltage of said driven output signal being indicative of a difference in voltages of said first and second differential input signals;
means for setting a resistance of first impedance circuitry, coupled in series to said paths, by applying a first control signal to said first impedance circuitry; and
means for setting a resistance of second impedance circuitry, coupled in series to said paths, by applying a second control signal to said second impedance circuitry.

* * * * *

UNITED STATES PATENT AND TRADEMARK OFFICE
CERTIFICATE OF CORRECTION

PATENT NO. : 7,365,570 B2
APPLICATION NO. : 11/137978
DATED : April 29, 2008
INVENTOR(S) : King It is certified that error appears in the above-identified patent and that said Letters Patent is hereby corrected as shown below:

On the face page, in field (56), under "U.S. Patent Documents", in column 1, line 1, delete "Wahistrom" and insert -- Wahlstrom --, therefor.

On the face page, in field (56), under "Other Publications", in column 2, line 2, delete "1996" and insert -- 1998 --, therefor.

In column 6, line 44, in Claim 10, delete "f or" and insert -- for --, therefor.

Signed and Sealed this

Fifth Day of August, 2008

JON W. DUDAS
*Director of the United States Patent and Trademark Office*